(12) United States Patent
Adams et al.

(10) Patent No.: US 7,230,336 B2
(45) Date of Patent: Jun. 12, 2007

(54) DUAL DAMASCENE COPPER INTERCONNECT TO A DAMASCENE TUNGSTEN WIRING LEVEL

(75) Inventors: Charlotte D Adams, Poughkeepsie, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 10/338,624

(22) Filed: Jan. 7, 2003

(65) Prior Publication Data

US 2003/0232494 A1 Dec. 18, 2003

Related U.S. Application Data

(62) Division of application No. 09/816,977, filed on Mar. 23, 2001, now Pat. No. 6,566,242.

(51) Int. Cl.
*H01L 29/40* (2006.01)
(52) U.S. Cl. .................. 257/758; 257/760; 257/763
(58) Field of Classification Search ............ 438/761, 438/638, 637, 629, 627, 624; 257/774, 763, 257/762, 760, 758
See application file for complete search history.

(56) References Cited

U.S. PATENT DOCUMENTS

| | | | |
|---|---|---|---|
| 4,789,648 A | 12/1988 | Chow et al. | |
| 5,071,518 A | 12/1991 | Pan | |
| 5,137,597 A | 8/1992 | Curry, II et al. | |
| 5,169,802 A | 12/1992 | Yeh | |
| 5,422,309 A | 6/1995 | Zettler et al. | |
| 5,447,887 A | 9/1995 | Filipiak et al. | |
| 5,821,168 A * | 10/1998 | Jain ........................... | 438/692 |
| 5,895,261 A | 4/1999 | Schinella et al. | |
| 5,946,563 A | 8/1999 | Uehara et al. | |
| 5,950,102 A | 9/1999 | Lee | |
| 6,028,015 A * | 2/2000 | Wang et al. ................ | 438/789 |
| 6,051,881 A | 4/2000 | Klein et al. | |
| 6,096,655 A | 8/2000 | Lee et al. | |
| 6,168,984 B1 * | 1/2001 | Yoo et al. ................... | 438/239 |
| 6,211,071 B1 * | 4/2001 | Lukanc et al. .............. | 438/640 |
| 6,218,302 B1 * | 4/2001 | Braeckelmann et al. .... | 438/687 |
| 6,284,657 B1 * | 9/2001 | Chooi et al. ................ | 438/687 |
| 6,326,299 B1 * | 12/2001 | Homma et al. ............. | 438/633 |
| 6,326,301 B1 * | 12/2001 | Venkatesan et al. ........ | 438/638 |
| 6,541,863 B1 * | 4/2003 | Horstmann et al. ......... | 257/753 |
| 6,576,550 B1 * | 6/2003 | Brase et al. ................ | 438/687 |

FOREIGN PATENT DOCUMENTS

EP 0 751 566 1/1997

* cited by examiner

*Primary Examiner*—Michael Trinh
(74) *Attorney, Agent, or Firm*—Schmeiser, Olsen & Watts; William D. Sabo

(57) ABSTRACT

A method and structure for fabricating a dual damascene copper interconnect which electrically contacts a damascene tungsten wiring level. The method forms a first layer on a semiconductor substrate, a silicon nitride layer on the first layer, and a silicon dioxide layer on the silicon nitride layer. The first layer includes damascene tungsten interconnect regions separated by insulative dielectric material. A continuous space is formed by etching two contact troughs through the silicon dioxide and silicon nitride layers to expose damascene tungsten interconnect regions, and by etching a top portion of the silicon dioxide layer between the two contact troughs. A reduced-height portion of the silicon dioxide layer remains between the two contact troughs. The continuous space is filled with damascene copper. The resulting dual damascene copper interconnect electrically contacts the exposed damascene tungsten interconnect regions.

12 Claims, 11 Drawing Sheets

DUAL DAMASCENE COPPER INTERCONNECT TO A DAMASCENE TUNGSTEN WIRING LEVEL

This application is a divisional of Ser. No. 09/816,977; filed on Mar. 23, 2001 and issued on May 20, 2003 as U.S. Pat. No. 6,566,242

BACKGROUND OF THE INVENTION

1. Technical Field

The present invention relates to a method and structure for fabricating a dual damascene copper wiring interconnect contacting a damascene tungsten wiring level.

2. Related Art

An integrated circuit fabricated on a semiconductor substrate typically requires multiple levels of metal interconnections for electrically interconnecting discrete semiconductor devices on the semiconductor substrate. A lower wiring level of damascene tungsten contacts is commonly used to provide local interconnections between the semiconductor devices which exist within and upon the substrate layer. Unfortunately, it is problematic to generate reliable, low resistance contacts between an upper level of damascene copper wiring and the lower wiring level of damascene tungsten contacts.

There is a need for a method and structure that generates reliable, low resistance contacts between an upper level of damascene copper wiring and the lower wiring level of damascene tungsten contacts.

SUMMARY OF THE INVENTION

The present invention presents a method for fabricating an electronic structure, said method comprising the steps of:

providing a wafer having a semiconductor substrate;

forming a first layer on the semiconductor substrate, wherein the first layer includes a plurality of electrically conducting regions, wherein each electrically conductive region includes an electrically conductive material selected from the group consisting of tungsten and silicon, and wherein the electrically conducting regions are separated by insulative dielectric material;

forming an etch stop layer over the first layer, wherein the etch stop layer includes an etch stop insulative material;

forming an insulator layer over the etch stop layer, wherein the insulator layer includes an electrically insulative material;

forming a plurality of contact vias extending through the insulator layer down to the etch stop layer and over corresponding electrically conducting regions such that there is not substantial rounding of the corners at the top of the reduced height portion of the insulator layer;

etching a top portion of the insulator layer adjacent each contact via, leaving a reduced-height portion of the insulator layer adjacent each contact via such that a continuous space is formed, wherein the continuous space includes each contact via and a space above the reduced-height portion of the insulator layer;

etching the etch stop layer at the bottom of each contact via, which exposes top surfaces of the corresponding electrically conducting regions below each contact via; and filling the continuous space with a refractory metal liner and damascene copper such that a damascene copper interconnect is formed within the continuous space, wherein the damascene copper interconnect is in electrically conductive contact with the top portions of the electrically conducting region.

The present invention provides an electronic structure, comprising:

a semiconductor substrate;

a first layer on the semiconductor substrate, wherein the first layer includes a plurality of electrically conducting regions, wherein the electrically conductive regions each include an electrically conductive material selected from the group consisting of tungsten and silicon, and wherein the electrically conducting regions are separated by insulative material;

a damascene copper interconnect wiring level having a plurality of damascene copper wires within one or more corresponding damascene contact vias wherein each damascene copper wire is in electrically conductive contact with a corresponding conducting region of the electrically conducting regions;

an etch stop layer on the first layer, wherein each etch stop layer does not exist where the damascene contact via exists, and wherein the etch stop layer includes an etch stop insulative material;

a first insulator region of an insulator layer on a first portion of the etch stop layer and contacting a first surface of the damascene copper interconnect, wherein the first insulator region includes an electrically insulative material;

a second insulator region of the insulator layer on a second portion of the etch stop layer and contacting a second surface of the damascene copper interconnect, wherein the second insulator region includes the electrically insulative material; and a third insulator region on a third portion of the etch stop layer and disposed between the damascene copper interconnect and the third portion of the etch stop layer, wherein the second insulator region includes the electrically insulative material.

The present invention provides a method of cleaning a surface of a volume of material, comprising the steps of:

providing the volume of material, wherein the material includes a refractory metal or silicon; and acid cleaning with hydrofluoric acid the surface of the volume of material.

The present invention further provides a method for fabricating an electronic structure, said method comprising the steps of:

providing a wafer having a semiconductor substrate;

forming a first layer on the semiconductor substrate, wherein the first layer includes a plurality of electrically conducting regions, wherein each electrically conductive region includes an electrically conductive material selected from the group consisting of tungsten and silicon, and wherein the electrically conducting regions are separated by insulative material;

forming an etch stop layer over the first layer, wherein the etch stop layer includes an etch stop insulative material;

forming an insulator layer over the etch stop layer, wherein the insulator layer includes an electrically insulative material;

forming a contact via extending through the insulator layer down to the etch stop layer and over a corresponding electrically conducting region such that there is not substantial rounding of the corners at the top of the reduced height portion of the insulator layer;

etching the etch stop layer at the bottom of the contact via, which exposes the top surface of the corresponding electrically conducting region below the contact via; and filling the contact via with a refractory metal liner and damascene copper such that a damascene copper interconnect is formed within the contact via, wherein the damascene copper interconnect is in electrically conductive contact with the top portion of the electrically conducting region.

The present invention therefore provides a method and structure that generates reliable, low resistance contacts between an upper level of damascene copper wiring and the lower wiring level of damascene tungsten contacts.

DETAILED DESCRIPTION OF THE INVENTION

The present invention discloses a structure and associated method of fabrication of a high-aspect-ratio dual damascene copper interconnect electrically coupled to a damascene tungsten local wiring level. Throughout this disclosure, the phrase "damascene tungsten" is used for the sake of clarity, and not to limit the invention. The tungsten in the damascene tungsten wiring level may be replaced by any suitable damascene conductor, including, inter alia, polysilicon, etc. Also, the phrase "damascene copper" is understood to mean that one or more trenches are made in a dielectric layer, one or more levels of refractory metal liners are deposited in the trench(es), the trench(es) is filled with copper and polished flat leaving liner and copper in the trench(es). Furthermore, the present invention is described in terms of two contact vias and troughs. This has been done for the sake of clarity, and not to limit the invention. One skilled in the art will recognize that there may be one or more contact vias, and also that one or more troughs may be used.

Figure 1A:
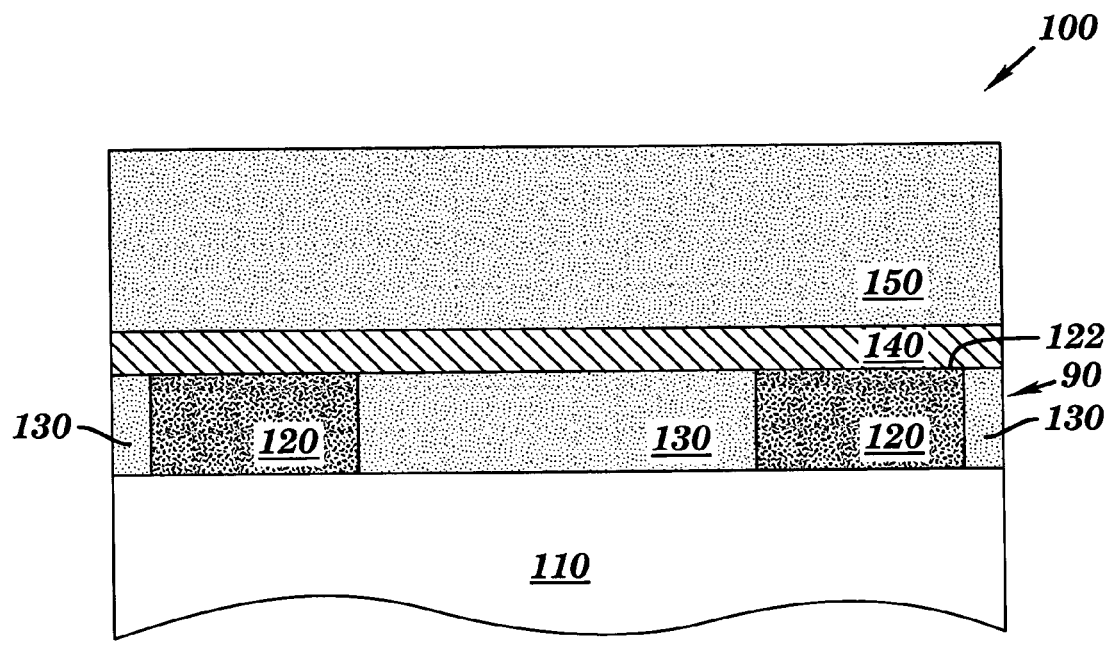
FIG. 1A depicts a cross-sectional view of an electronic structure having a damascene tungsten wiring level on a silicon substrate, a silicon nitride layer on the damascene tungsten wiring level, and a silicon dioxide layer on the silicon nitride layer, in accordance with embodiments of the present invention.

Referring now to the drawings and starting with FIG. 1A, a cross-sectional view of a semiconductor structure or wafer 100 is shown. The wafer 100 has a substrate 1110, which in the preferred embodiment is a silicon substrate, but which may include, inter alia, a p-type or n-type single crystal silicon, silicon-on-insulator (SOI), quartz, sapphire, gallium arsenide, etc. Numerous devices (not shown) such as gates, transistors, diffusions, capacitors, etc., may be embedded in the substrate 110.

The devices in the substrate 110 are contacted, using standard processing, by damascene tungsten electrically conductive interconnects 120 which are formed in a damascene tungsten local wiring level 90. Titanium or titanium nitride lined tungsten or doped polysilicon, among other conductors, are employed as the conductor in wiring level 90. In this disclosure, we will assume tungsten is the preferred embodiment. The damascene tungsten wiring level 90 exemplifies a damascene refractory metal local interconnect layer. The damascene tungsten interconnects 120 are isolated from one another by an insulative dielectric material 130 such as, inter alia, borophosphosilicate glass (BPSG) or phosphosilicate glass (PSG). A surface 122 of the damascene tungsten local wiring level 90 (i.e., of the damascene tungsten interconnects 120 and the insulative dielectric material 130) is then planarized using known techniques. This resulting flat surface 122 forms the basis for the processing sequence disclosed in the present invention.

A relatively thin (such as, inter alia, approximately 50 nm) layer of film 140 is deposited over the layer of damascene tungsten interconnects 120 and insulative dielectric material 130. This film 140, which is typically a silicon nitride film, may be deposited using plasma-enhanced chemical vapor deposition (PECVD), high density plasma chemical vapor deposition (HDPCVD), low pressure chemical vapor deposition (LPCVD), or other suitable processing technique known in the art.

The film 140 is followed by a relatively thick (such as, approximately 150 to 1000 nm) silicon dioxide layer 150. The film 140 and silicon dioxide layer 150 films are preferably deposited using low charging damage processes, preferably using low pressure RF power density silane-oxide based chemistries or high pressure (i.e., approximately 14 Torr) tetraethylorthosilicate (TEOS) chemistry PECVD. Alternatively, flourine doped or carbon doped dielectrics could be used to reduce the dielectric constant. The film 140 is desirable to act as a reactive ion etching (RIE) stop for subsequent etching, as discussed infra, and also will act as a copper diffusion barrier. Film 140 could be any dielectric which acts as a RIE stop during the etching of layer 150, such as, inter alia, silicon dioxide, flourinated silicon dioxide, phosphosilicate glass, borophosphosilicate glass, $CH_3$-doped silicon dioxide, $SiC_xH_y$ or $SiC_xH_yN_z$.

Figure 2:
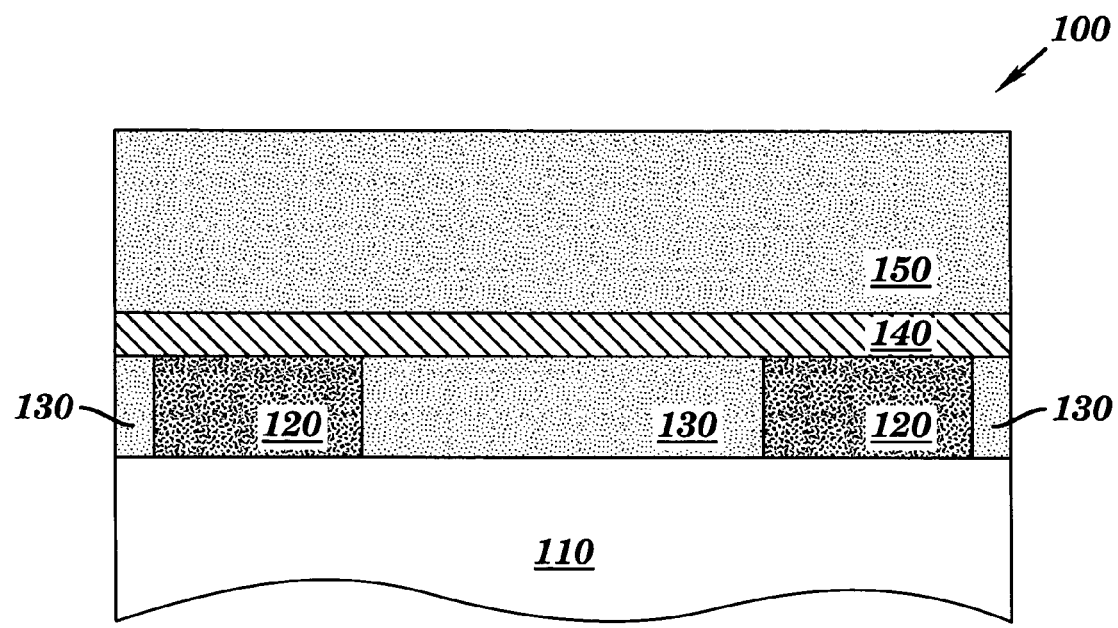
FIG. 2 depicts FIG. 1A after the silicon dioxide layer has been polished, to remove or reduce prior level scratches and topography, to a reduced height and cleaned.

FIG. 2 depicts FIG. 1A after the silicon dioxide layer 150 has been polished to a reduced height and cleaned by any method known in the art. For example, a chemical-mechanical polish (CMP) may be used to polish off some of the silicon dioxide layer 150, such as, inter alia, about 150 nm. The purpose of this polishing step is to planarize the silicon dioxide layer 150 to remove any topography which may have resulted from the process used to make the damascene tungsten interconnects 120. Generally, when damascene processing is used to make damascene tungsten interconnects, two problems can arise. Referring to FIG. 1A, the first problem is that the insulative dielectric material 130 may be scratched, and those scratches in the insulative dielectric material 130 can replicate in the next silicon dioxide layer 150. The second problem is that the damascene tungsten interconnects 120 may either protrude above the insulative dielectric material 130 by a small amount, or they may be recessed below the insulative dielectric material 130 surface a small amount. This small amount of topography due to process defects (e.g., scratches, protrusions, or insufficient tungsten fill, recessed damascene tungsten layer, etc.) of the damascene tungsten interconnects 120 will be smoothed out by the polish processing step. Thus, the purpose of this silicon dioxide polishing step is to eliminate the aforementioned small topography.

Figure 1B:
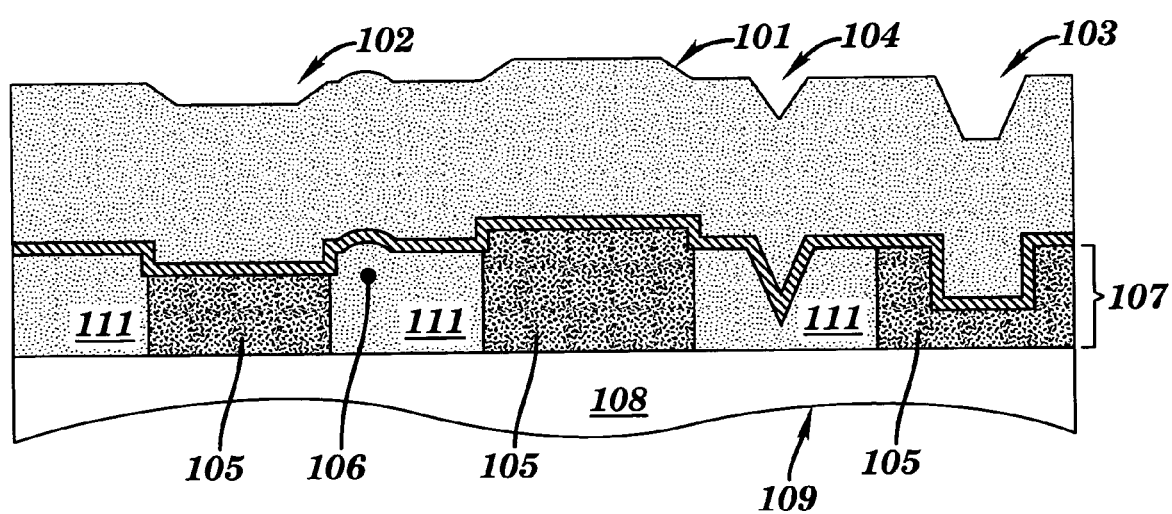
FIG. 1B depicts a cross-sectional view of an electronic structure having a damascene tungsten wiring level on a silicon substrate similar to FIG. 1A, wherein a variety of undesirable manufacturing topographies are shown, including a bump, a recess, a seam, a scratch, and an embedded particle.

In FIG. 1B is shown a version of a cross-sectional view of an electronic structure 109 having a damascene tungsten wiring level 107 on a silicon substrate 108 similar to FIG. 1A, and wherein a variety of undesirable manufacturing topographies are shown, including a bump 101, a recess 102, a seam 103, a scratch 104, and an embedded particle 106. Reference numerals 111 and 105 in FIG. 1B respectively correspond to reference numerals 130 and 120 in FIG. 1A.

Note that the CMP step is optimized, and can be avoided if the subsequent copper/tantalum nitride/tantalum CMP steps are modified to overpolish into the insulator layer 150. The disadvantage of this approach, is that this leads to much more damascene copper wire resistance and capacitance variability.

The CMP step is followed by a brush-clean processing step, and alternatively, a hydroflouric (HF) acid etch, which may be, inter alia, a 500:1 buffered hydroflouric (BHF) acid etch. The purpose of these steps is threefold: to clean residual polish slurry, mobile ions, etc., from the wafer; to etch off a small portion of the silicon dioxide layer 150 to further remove contamination from the wafer surface; and to enhance adhesion of the subsequent silicon dioxide cap deposition, as discussed infra.

A post-CMP thickness measurement technique is also used to control the resulting or "outgoing" silicon dioxide layer 150 thickness. If the outgoing silicon dioxide layer 150 thickness is not well controlled, then a subsequent contact RIE underetch/overetch process window is reduced or eliminated. The preferred CMP removal is about 150+/−30 nm, although more or less CMP removal is acceptable.

Figure 3A:
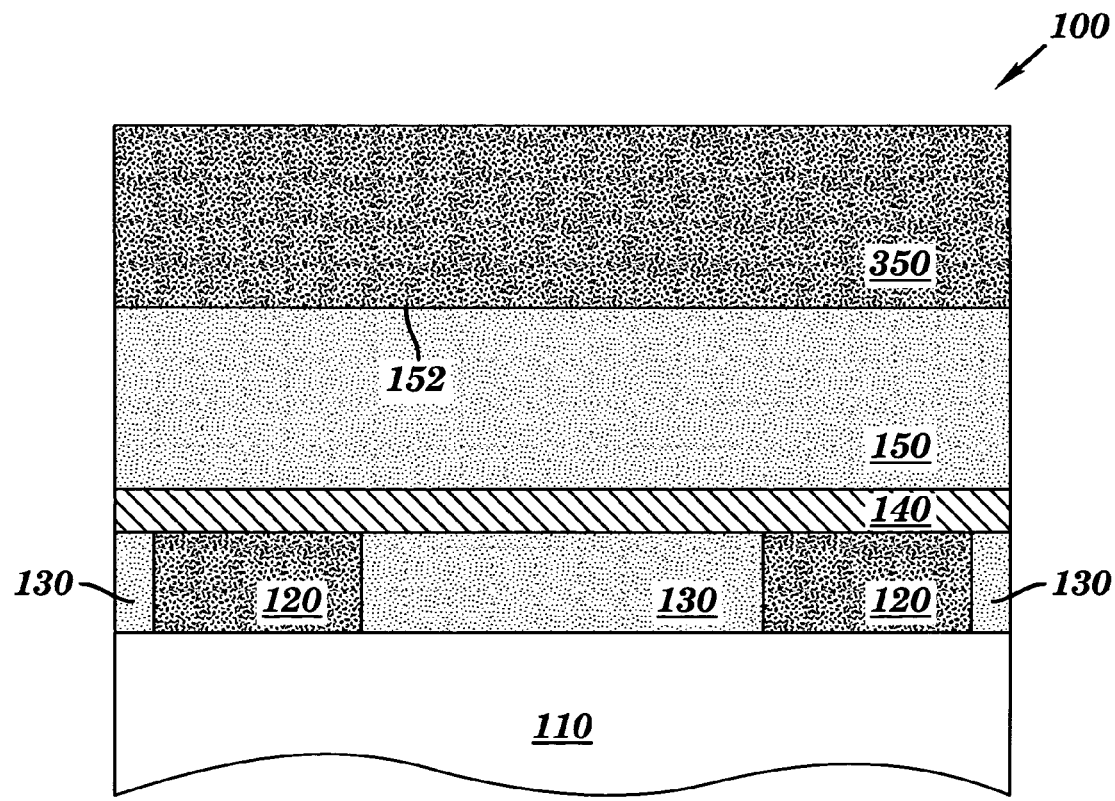
FIG. 3A depicts FIG. 2 after a silicon dioxide cap has been deposited on the silicon dioxide layer.

FIG. 3A illustrates the wafer 100 after an optional post-silicon dioxide CMP PECVD silicon dioxide cap layer 350 deposition is performed. The silicon dioxide cap layer 350 may be undoped, or it may contain doping (such as, e.g., fluorine or carbon) to reduce the dielectric constant of the silicon dioxide cap layer 350 material. This silicon dioxide cap layer 350 deposition, while not required, is beneficial because it reduces electrical shorts in a subsequently deposited copper layer due to any scratches which may have occurred during the CMP of the silicon dioxide layer 150. The final thickness of this silicon dioxide cap layer 350 is tuned, such that the heights of subsequently formed contacts and copper layers are optimized. For example, for a 250 nm wide contact and copper layer, one possible set of heights would be 400 nm and 300 nm for the contact and the copper layer, respectively.

Figure 3B:
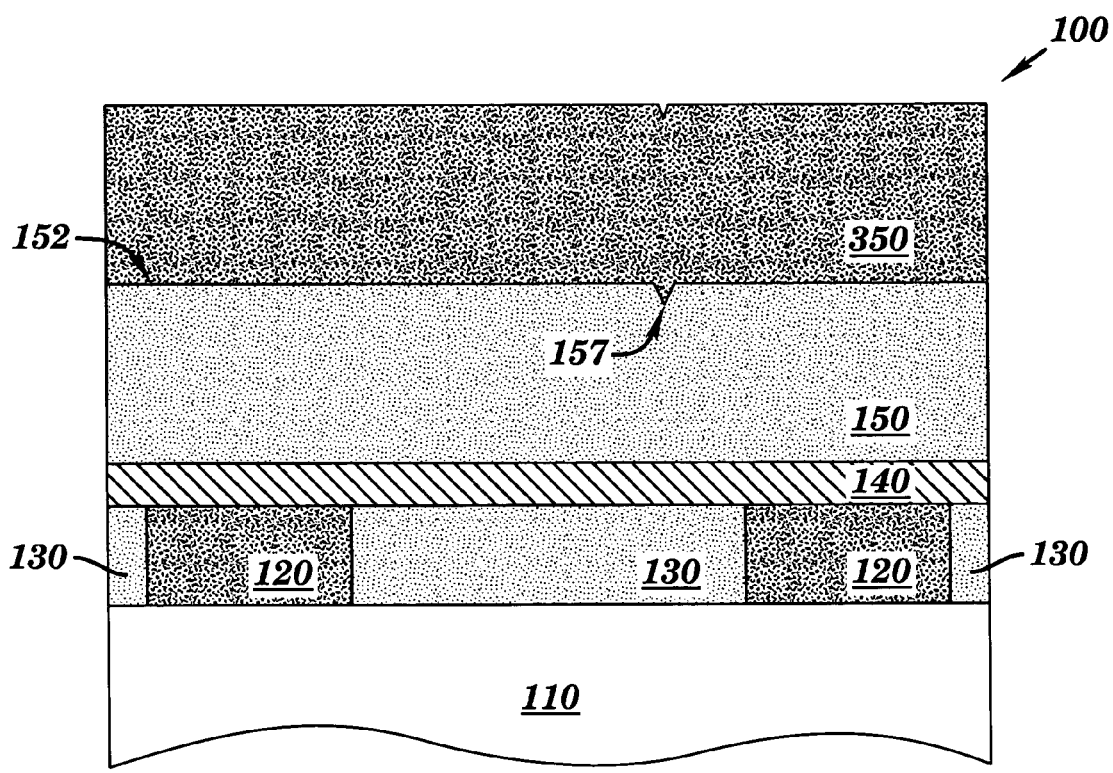
FIG. 3B depicts FIG. 3A with a scratch or other topography in one layer that is replicated in a second layer.

A feature of the silicon dioxide cap layer 350 is that it further reduces surface layer scratch propagation. That is, if there is a scratch 157 in the lower silicon dioxide layer 150, it will be smoothed out by the deposition of the conformal, or near conformal, silicon dioxide cap layer 350 as shown in FIG. 3B.

Figure 4:
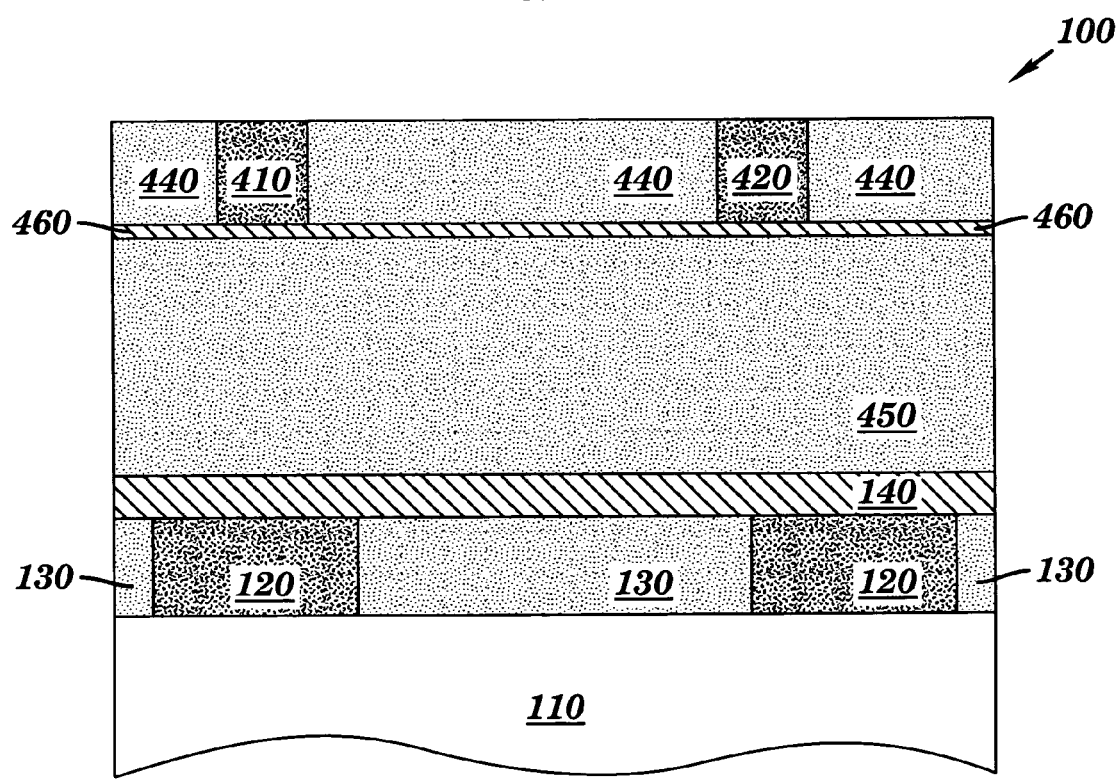
FIG. 4 depicts a FIG. 3A after a resist layer has been deposited on the silicon dioxide cap.

FIG. 4 depicts the structure of FIG. 3A after a photoresist layer 440 has been deposited on the silicon dioxide cap layer 350 (see FIG. 3A) to pattern contact vias under portions 410 and 420 of the photoresist layer 440 using standard procedures known in the art. In FIG. 4, the silicon dioxide layer 150 and the silicon dioxide cap layer 350 of FIG. 3A in composite, has been replaced for simplicity of illustration by a silicon dioxide layer 450. The photoresist layer 440 may also use a first anti-reflective coating (ARC) layer 460, which is deposited upon the silicon dioxide layer 450. In general, an ARC layer improves the ability to resolve small features when the photoresist is exposed.

Figure 5:
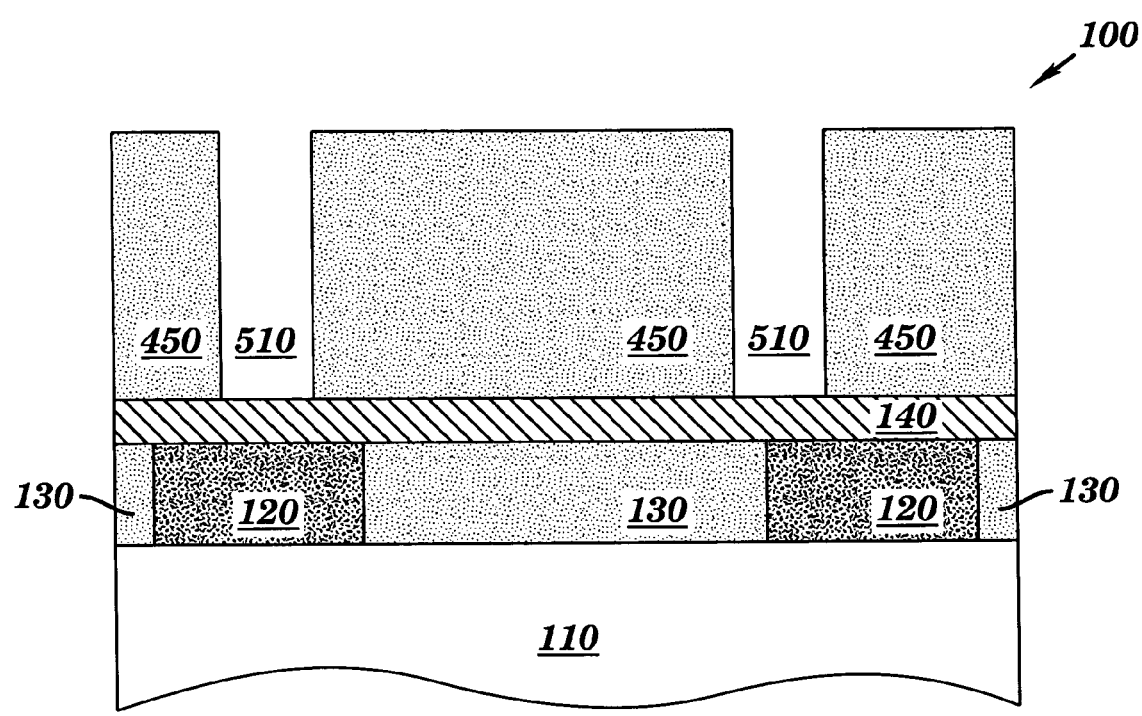
FIG. 5 depicts FIG. 4 after etching the resist to form contact vias to the silicon nitride layer and after removal of the resist layer.

FIG. 5 depicts the structure of FIG. 4 after selective etching of the silicon dioxide layer 450 to form two contact via holes 510 which extend through the silicon dioxide layer 450 to the film 140. The contact via holes 510 are located underneath the portions 410 and 420 of FIG. 4. A selective silicon dioxide RIE chemistry is employed such that the contact via holes 510 extend down to, but not through, the film 140. This process stage actually involves a two step reactive ion etch (RIE). In the first step, the first ARC layer 460 (see FIG. 4) is etched using RIE, or, optionally, using a selective etch chemistry so that the etch is stopped on the silicon dioxide layer 450. In the second step of the etch, the silicon dioxide layer 450 is etched, using a selective etch chemistry, as known in the art, which substantially stops on the film 140, with selectivities on the order of 10:1, or better. "Selectivity" is defined as the etch rate of the material you want to etch divided by the etch rate of the material you don't want to etch. After the etching is completed, the photoresist layer 440 is stripped, preferably using an oxygen plasma or downstream plasma drip process. Note that standard wet chemical photoresist strip methods, such as sulfuric acid mixed with hydrogen peroxide, may etch the conductor in 120 through pinholes in the film 140, and therefore should not be used. Removing photoresist with a nondirectional strip process, such that corners 455 (see FIG. 10) are not rounded, is highly desirable. The non-rounded corners result in better copper fill. Further, non-rounded or square corners at 455 are desirable because electrical shorts originating at these points can be avoided.

Stripping the photoresist during the second step of this dual damascene process (i.e., involving the printing and RIE etching of the wire trough) is a critical process because of concerns of rounding the upper corners of the wire trough. If the upper wire trough corners are substantially rounded, the likelihood for electrical shorts between wires increases. This means that the photoresist strip steps, employed either when the wire trough photoresist is stripped before RIE etching the wire troughs because lithographic printing or registration problems (referred to as lithographic rework) or after the trough RIE etch, must be substantially nondirectional during the portion of the photoresist strip when there is resist left on the wafer. Note that the photoresist strip is broken up into two steps, the first step removes the photoresist from blanket surfaces on the wafer and the second step removes photoresist from trenches or other topographic features on the wafer and includes an overstrip portion, during which the photoresist strip process continues to run despite the full removal of the photoresist. During the first photoresist step, if performed in a plasma strip tool, striped photoresist and/or RIE etch residuals mix with the strip chemistry and can add a significant sputter and RIE component to the photoresist strip process. If a plasma strip process with substantial wafer bias is employed, the wafer bias increases ion bombardment on the wafer which results in increased corner rounding of the wire troughs. This problem can be significantly reduced by performing the first photoresist step either in a non-plasma environment (i.e., solvent strip, downstream plasma, ozone strip, etc.) or by minimizing the wafer RF bias power applied to the wafer. The optimal plasma photoresist strip process uses a non-plasma or low RF bias power on the wafer plasma photoresist first step followed by a high RF bias power on the wafer plasma strip for the second step. The high RF bias power second step is needed to remove photoresist, ARC, or RIE etch residuals from trenches or other topographic features on the wafer.

Next, an optional step may be performed which consists of an etch using, inter alia, a 100:1 dilute HF acid etch to remove approximately 5 to 10 nm of silicon dioxide. This step removes etch residuals of the prior second step etch. Alternatively, in place of the aqueous HF acid solution, deionized water, or any solvent known in the art as useful for cleaning etch residuals could be used.

Figure 6:
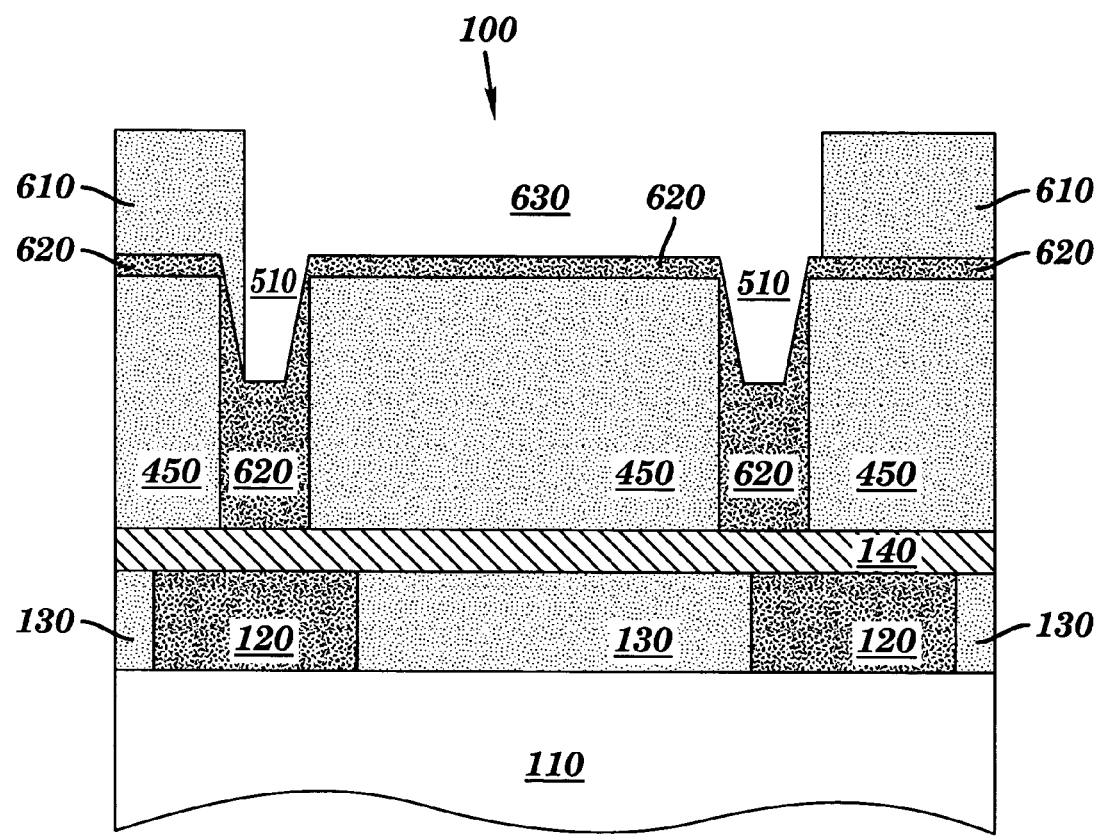
FIG. 6 depicts FIG. 5 after deposition and reflow of an anti-reflective coating layer which covers the entire wafer surface including the interiors of the contact vias, and deposition of a photoresist layer on the anti-reflective coating layer, followed by lithographic patterning and opening of the photoresist.

FIG. 6 depicts the structure of FIG. 5 after deposition, using techniques known in the art, of a second anti-reflective coating layer 620 which covers the entire surface of the wafer 100, including the interiors of the damascene vias 510. The second ARC layer 620 is processed using a known technique (e.g., via-first dual damascene processing) which reflows the anti-reflective coating material into the contact holes or damascene vias 510 at a low temperature (e.g., approximately 170 to 230° C.) as is known in the art related to via-first dual damascene processing. This deposition of the ARC layer 620 is followed by the subsequent deposition and patterning of photoresist layer 610 which is used to selectively open a continuous space 630 in the second anti-reflective layer 620. The patterned photoresist layer 610 is located on top of the ARC layer 620, and is patterned with the desired damascene wire pattern.

Figure 7:
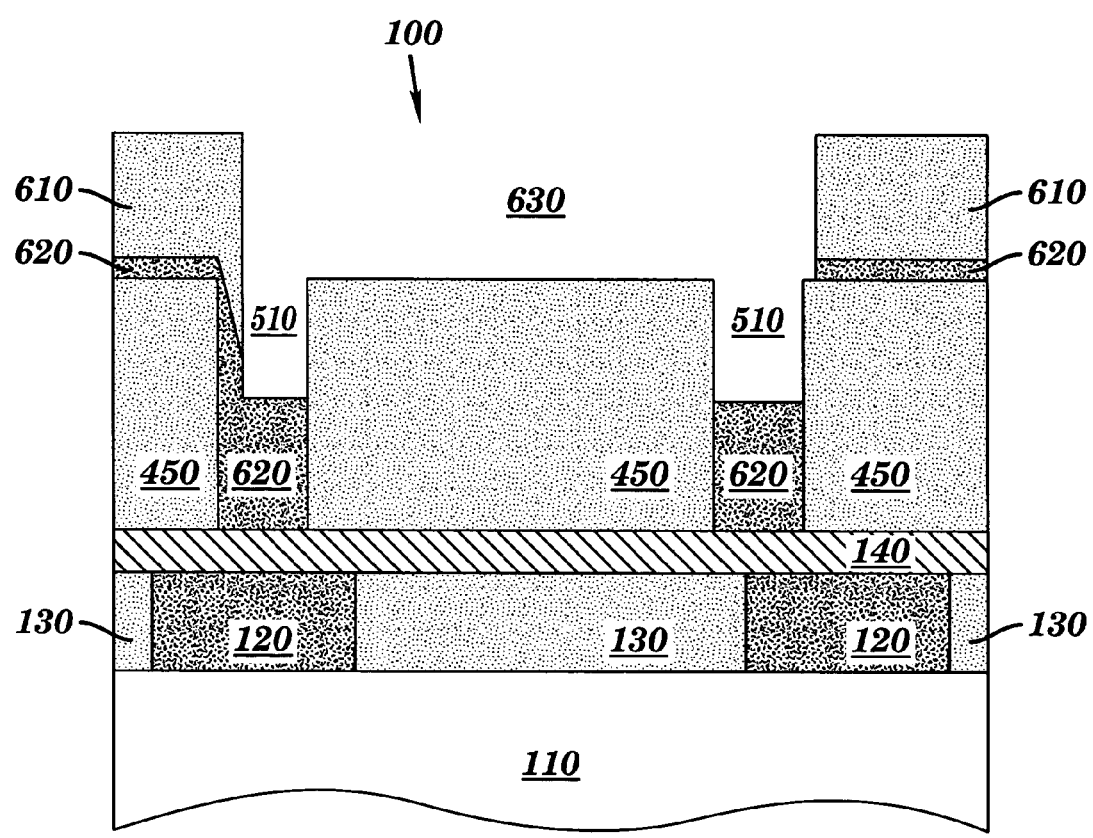
FIG. 7 depicts FIG. 6 after etching of the anti-reflective coating has been performed, using a process which etches the anti-reflective coating but does not etch the silicon dioxide.

Referring now to FIG. 7, the structure of FIG. 6 is shown following etching of exposed portions of the second anti-reflective coating layer 620, using a process which etches the second anti-reflective coating layer 620 in selected areas, but which does not substantially etch the silicon dioxide layer 450.

Figure 8:
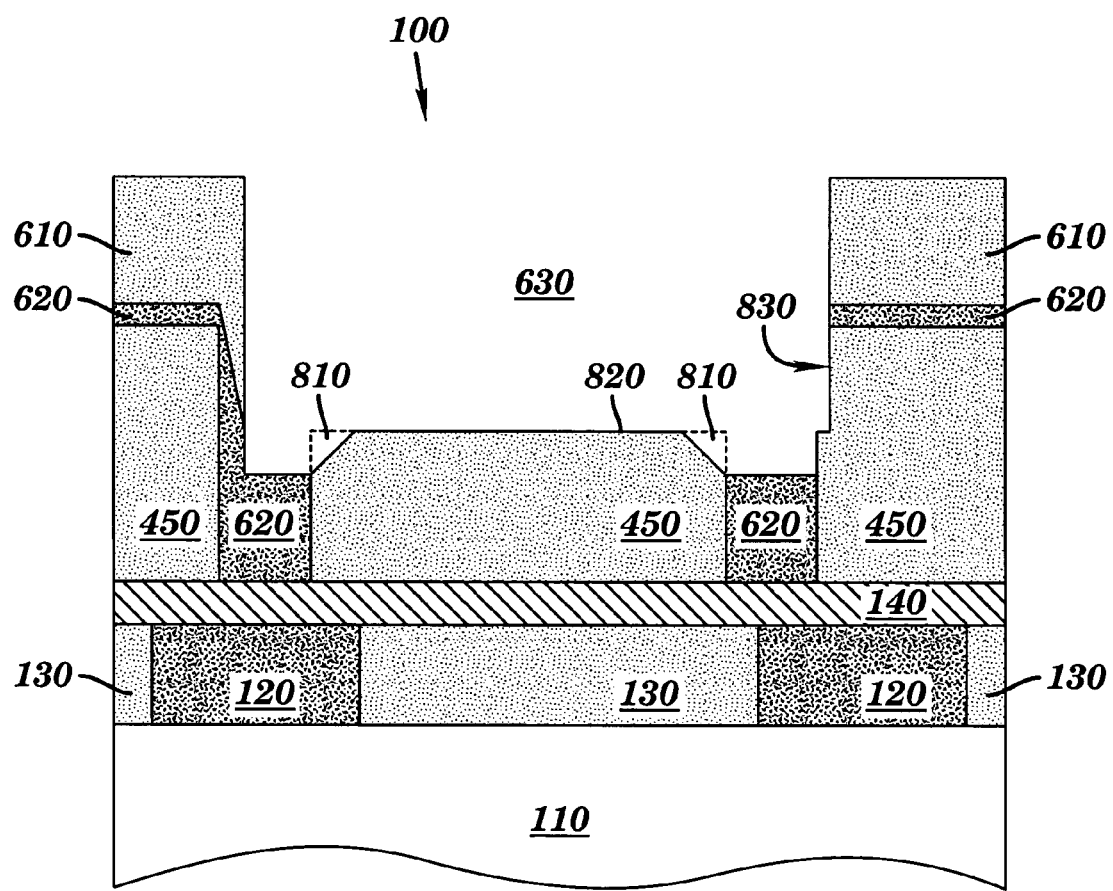
FIG. 8 depicts FIG. 7 after etching of a top portion of the silicon dioxide between the contact troughs, and etching to round off the corners of the silicon dioxide to promote good liner and copper fill.

FIG. 8 depicts the structure of FIG. 7 after continued RIE etching to a reduced height of a portion of the silicon dioxide layer 450 that exists between the damascene troughs, and further etching to round off corners 810 (shown in phantom) of the silicon dioxide layer 450 (at the top surface 820 of the silicon dioxide layer 450) to promote good liner and copper fill in subsequent processing steps. Etching of the portion of the silicon dioxide layer 450 to a reduced height results in an increase in the continuous space 630, now extending between damascene vias 510 and silicon dioxide layer 450. The etch used in this step may be, inter alia, a silicon dioxide RIE which is used to etch the damascene vias 510 to a depth which is deeper (e.g., by approximately 50 nm) than the desired final depth. This RIE is optimized to round the corners 810 of the silicon dioxide layer 450, while leaving nearly vertical contact sidewalls 830 on the top of the damascene via 510.

Figure 9:
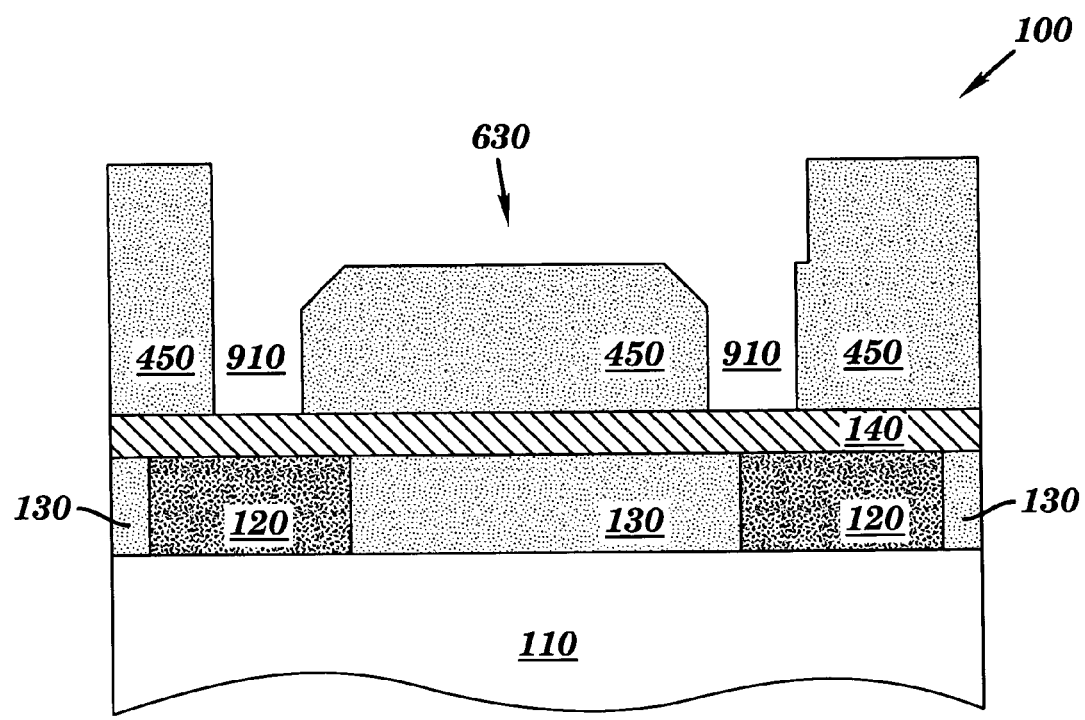
FIG. 9 depicts FIG. 8 after the photoresist layer and the anti-reflective layer have both been stripped away.

FIG. 9 depicts the structure of FIG. 8 after the photoresist layer 610 and the second anti-reflective coating layer 620 have both been stripped away, leaving contact vias 910. The photoresist layer 610 strip step is performed such that the ion bombardment on the wafer 100 is minimized, to minimize the rounding of corners 810. A non-directional strip, such as, inter alia, a low wafer bias plasma strip, can be used. Care must be taken in the photoresist layer 620 strip step so that the ARC layer 610 in the contact vias 910 is removed. This means that, if an optical emission (or any) resist strip endpoint measurement is used to control the resist strip time, then a long overstrip, typically 100 to 200%, should be used. The continuous space 630 has been extended to include the contact vias 910.

In order to further minimize corner rounding, a high pressure strip process step may be performed. In a dual electrode system using radio frequency (RF) power, most or all of the RF power should be coupled to the top electrode to minimize wafer ion bombardment. Alternatively, a two-step strip process can be employed with RF power coupled to the electrode only during the second step of the two step strip when the resist of the photoresist layer 620 has been stripped. A two step strip process would aid in removing polymer or residual ARC from the contact vias 910. In a single electrode system, the RF power must be minimized during the resist strip step, prior to an overstrip step used in the single electrode system, to minimize ion bombardment-induced corner rounding. Note that, for all resist strip processes, the corner rounding is enhanced while flourinated resist remains on the wafer 100 and the critical parameter to control is the ion bombardment density/energy during the resist strip step, prior to the resist overstrip step(s).

Figure 10:
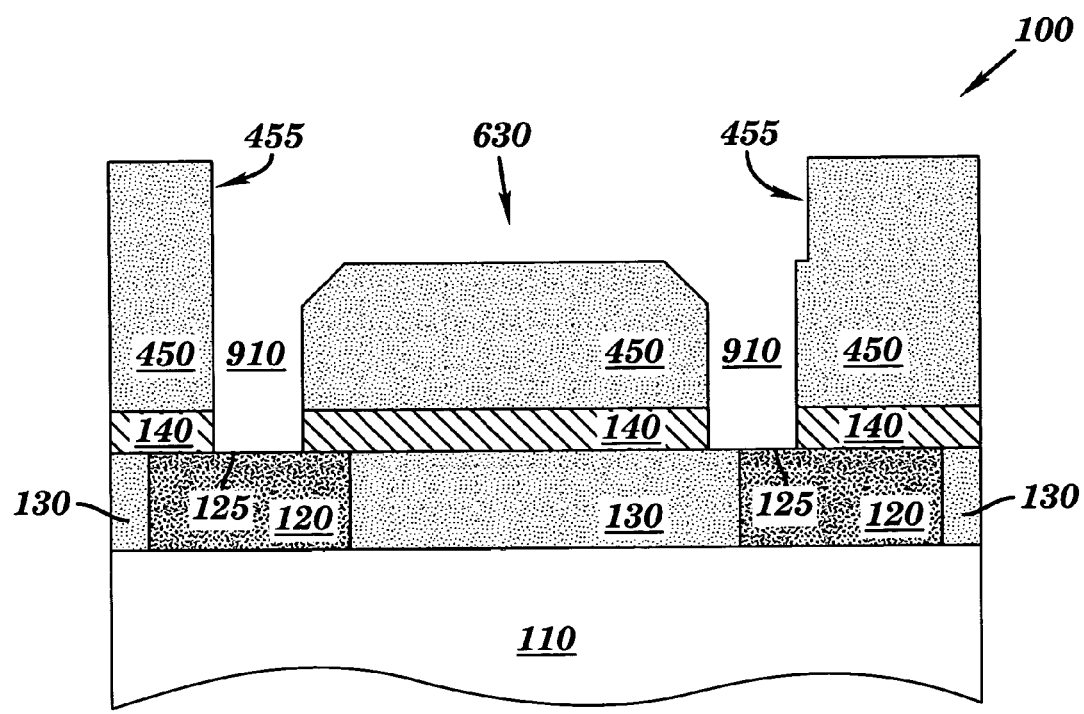
FIG. 10 depicts FIG. 9 after the silicon nitride layer at the bottom of each contact trough is etched.

FIG. 10 depicts the structure of FIG. 9 after the film 140 at the bottom of each contact via 910 is etched using industry standard RIE chemistry to extend each contact via 910 to top surfaces 125 of the damascene tungsten interconnects 120, wherein reference numeral 455 denotes the silicon dioxide layer 450 on the film 140 after said etching. Accordingly, the continuous space 630 has been further extended to include the extended contact vias 910. As will be discussed infra in conjunction with FIGS. 11–12, a dual damascene copper interconnect will be fanned in the continuous space 630. Thus, the bottom of each contact via 910 permits electrical contact with the top surfaces 125 of the damascene tungsten interconnects 120 by the dual damascene copper interconnect to be subsequently formed. In one embodiment of the RIE process method, die damascene vias 510 RIE (see FIG. 7), the resist strip of the photoresist layer 610 (see FIG. 8), and the film 140 RIE are all performed in a single RIE chamber or tool.

The next step in the process involves a hydroflouric (HF) acid clean (e.g., using a dilute 1% solution of hydroflouric acid) to remove approximately 10 nm of silicon dioxide from the wafer 100 and, particularly, from on the damascene tungsten interconnects 120. This acid clean is performed to deflourinate the surface and also to remove any residual polymer. The concentration of the hydroflouric acid may include, inter alia, between about 10:1 and about 500:1, preferably about 100:1. The 100:1 dilution here refers to diluting the HF as it comes from the bottle, which actually, as it comes from the manufacturer is about 1 part water to 1 part HF. The dilutions listed in this specification are with respect to the HF from the bottle.

Using hydroflouric acid to clean a contact down to tungsten or silicon is not known in the art, since solvent cleans, such as AZ™ or NMP™, are typically performed to clean off tungsten or silicided silicon surfaces. Hydroflouric acid is not known to etch refractory metal oxides or other such products (oxides formed from titanium, tungsten, cobalt, etc.). For these dual damascene structures, the standard AZ™, or other, solvent cleans performed for single damascene structures results in sharply degraded (i.e., sharply decreased) contact remittances of the refractory metal, perhaps due to either the inability to totally remove the solvent from voids in the damascene local tungsten interconnect, or to the inability to remove damaged regions on the tungsten surface.

The etch step of FIG. 10 may be followed with an argon (Ar) sputter clean which is directed to the sputter removal of silicon dioxide or other etch residuals such as tungsten oxide on top of the damascene tungsten interconnects 120 or elsewhere on the wafer 100. Typically, this argon sputter clean removes about 10 nm of silicon dioxide from planar surfaces. The argon gas may also include other dopant gases, such as, inter alia, hydrogen or helium. Also, the sputter clean needs to be of sufficiently long duration to fully remove the residue from the wafer 100. Empirical evidence shows that the time required to sputter away 5 nm of residue is insufficient to remove unwanted residue, while the necessary time to sputter away 10 nm is sufficient. However, if too much silicon dioxide is removed with the argon sputter clean, a problem arises in that rounding of the corners of the etched structures can result. Therefore, a balance must be found so that s sufficient amount is sputter cleaned, but not an excessive amount. An example of too much would be about 20 nm. An example of too little would be about 5 nm.

Figure 11:
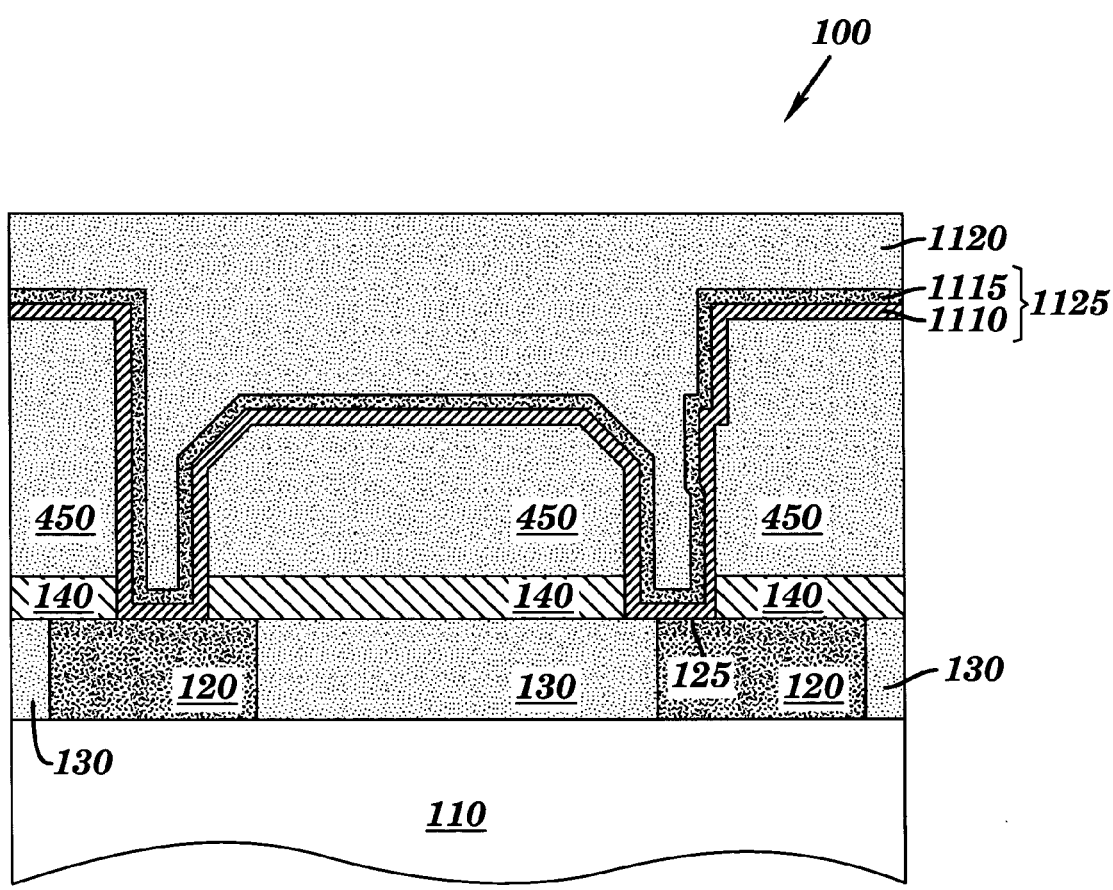
FIG. 11 depicts FIG. 10 after deposition of a standard copper diffusion barrier, comprising a film stack composed of layers of tantalum-nitride and tantalum over the entire wafer surface, depositing a copper seed layer, and depositing electroplated copper over the copper seed barrier.

After the sputter preclean, and referring now to FIG. 11, the structure of FIG. 10 is shown after deposition of a film stack 1125 which is composed of layers 1110 of tantalum-nitride and tantalum (copper diffusion barriers), and a thin sputtered copper layer 1115, which covers the exposed wafer 100 surfaces. This film stack 1125 provides good sidewall coverage. A tantalum nitride/tantalum/copper (TaN/Ta/Cu) deposition process, such as ionized physical vapor deposition (IPVD), hollow cathode magnetron (HCM), chemical vapor deposition (CVD), long-throw sputter, or a combination of these, is employed. For the geometries discussed in this disclosure, a 10 nm/40 nm/100 nm TaN/Ta/Cu film stack using IPVD was deposited, though many other TaN/Ta/Cu thickness combinations may be used. Although Ta is described herein, any other refractory metal or a combination of metals could be used instead of Ta, such as tantalum nitride, titanium nitride, tungsten nitride, tungsten, etc.

Figure 12:
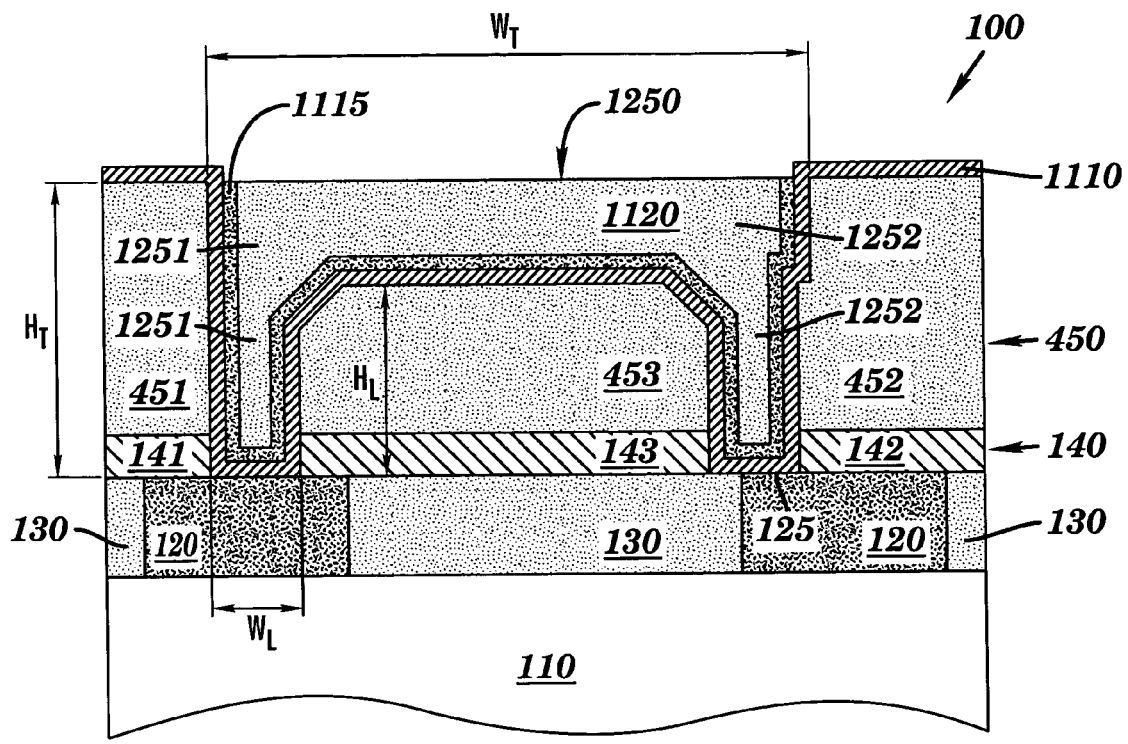
FIG. 12 depicts FIG. 11 after an upper portion of the copper on the wafer has been removed with a CMP process which does not remove the tantalum nitride and tantalum copper diffusion barrier, and a remaining exposed surface has been planarized.

The TaN/Ta layer 1110 is deposited as any standard copper diffusion barrier, using any refractory metal (listed supra), followed by a thin sputtered copper layer 1115. The thin sputtered copper layer 1115 acts as a seed film, for the subsequent copper plating. The sputtered copper layer 1115 may be replaced by electroless plated copper. Then, a thick copper layer 1120 is electroplated upon the entire wafer surface and fills all depressions. A nominal thickness for the tantalum nitride portion of the TaN/Ta layer 1110 is approximately 10 nm; for the tantalum portion of the TaN/Ta layer 1110 approximately 40 nm; and for the sputtered copper layer 1115, approximately 100 nm. However, these thicknesses can be tailored for the particular dimensions desired in the fabrication process. The typical depth of contact vias 910 is about 450 nm, and the minimum trough width of contact vias 910 is about 250 nm. The minimum contact width to the damascene tungsten interconnects 120 is about 250 nm, and the contact height is about 500 nm. The final height of the electroplated copper layer 1120 as shown in FIG. 12 is on the order of the total stack height, that is, the height of the film 140 plus the silicon dioxide layer 450. In this example, if the height of the film 140 and silicon dioxide layer 450 is about 750 nm, then the electroplated copper layer 1120 thickness is slightly thicker than about 750 nm. The reason that the electroplated copper layer 1120 must be slightly thicker than the height of the film 140 and the silicon dioxide layer 450, in combination, is because the electroplated copper layer 1120 tends to produce a nonconformal fill which does not come up on all surfaces equally. Therefore, to ensure that electroplated copper layer 1120 fits properly, it must be plated a little thicker, approximately 10% thicker, than the height of the film 140 and the silicon dioxide layer 450, in combination. Typically, with error (e.g., tolerances) and cross wafer thickness variation, the electroplated copper layer 1120 may be even thicker than just described. Other methods of copper fill, such as a combination of PVD and CVD could be used instead of electroplating. After the electroplated copper layer 1120 deposition, an optional anneal such as, inter alia, 100° C., 1 hour, is performed to crystallize the electroplated copper layer 1120.

FIG. 12 depicts the structure of FIG. 11 after the upper surface of the wafer 100 has been planarized using a copper chemical-mechanical polish process. This planarization process may be a wet-mechanical polish process used to remove the upper portion of the electroplated copper layer 1120 along with the top portion of the TaN/Ta layer 1110. The electroplated copper layer 1120 is polished using an industry-standard known process, and stopping on the TaN/Ta layer 1110. In general, it is well known in the art to polish copper and stop on a liner or endpoint, and then to switch processes and polish the liner. Then, one can CMP the wafer to remove the tantalum nitride and tantalum copper diffusion barrier. Alternatively, one can employ a single step CMP process which removes both the tantalum nitride/tantalum copper diffusion barrier in a single step.

However, because a dual damascene process has been executed, the polishing of the electroplated copper layer 1120 is preferably done for a longer period than for a single damascene process. In comparing single with a dual damascene process, using an endpointed copper polish, the overpolish for the dual damascene process should be 30 to 100% longer than for the single damascene process. This increased polish time is required to clear the copper between closely spaced damascene contacts due to the presence of corner rounding in these structures. Optimally, a copper polish process with an increased chemical etch component, for example one using 4% peroxide, is employed.

After the copper polish step, another polish step is employed to remove the top portion of the TaN/Ta layers 1110. This polish step continues down to the silicon dioxide layer 450. This step typically removes some (e.g., approximately 50 nm) of the silicon dioxide layer 450 as well. Following the planarizations/polishes, the remaining portions of the electroplated copper layer 1120, the sputtered (or electroless) copper layer 1115, and the TaN/Ta layer 1110, collectively constitute the dual damascene copper interconnect 1250 of the present invention.

Finally, after the CMP, an optional 300 to 450° C. anneal is employed to enhance the testability of the resultant dual damascene copper interconnect 1250, which is in electrically conductive contact with the damascene tungsten interconnects 120.

In FIG. 12, the dual damascene copper interconnect 1250 has contact vias 1251 and 1252. The contact vias 1251 and 1252 are portions of the dual damascene copper interconnect 1250 which make a direct electrical connection with the damascene tungsten interconnects 120. For a typical 180 nm technology, the contact vias 1251 and 1252 each have a width $W_L$ about 250 nm, and a height $H_L$ about 300 nm. Also in FIG. 12, the dual damascene copper interconnect 1250 has a total width $W_T$ about 250 nm, and a total height $H_T$ about 320 nm.

FIG. 12 shows the film 140 as having a first portion 141, a second portion 142, and a third portion 143. FIG. 12 also shows the silicon dioxide layer 450 as having a first portion 451, a second portion 452, and a third portion 453. The first portion 451 of the silicon dioxide layer 450 is on the first portion 141 of the film 140, and is contacting a first surface 1251 of the dual damascene copper interconnect 1250. The second portion 452 of the silicon dioxide layer 450 is on the second portion 142 of the film 140, and is contacting a second surface 1252 of the dual damascene copper interconnect 1250. The third portion 453 of the silicon dioxide layer 450 is on the third portion 143 of the film 140, and is disposed between the dual damascene copper interconnect 1250 and the third portion 143 of the film 140.

Figure 13:
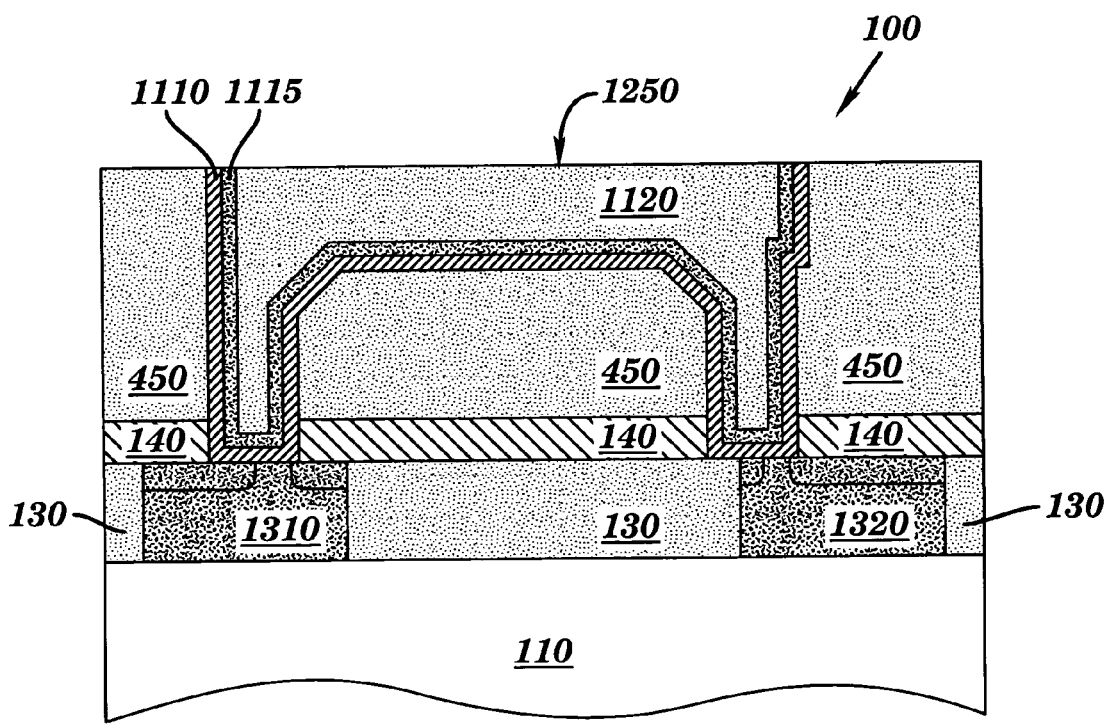
FIG. 13 depicts an alternative embodiment of FIG. 12 wherein damascene tungsten interconnects are replaced by semiconductor material and included semiconductor devices.

In an alternative embodiment of the present invention (FIG. 13), the damascene tungsten interconnects 120 of FIGS. 1A-12 can be replaced by silicon volumes 1310 and 1320 which may include diffusions, transistors, and other passive or active devices. In this embodiment, care must be exercised to prevent copper from diffusing through the TaNFFa liner 1110 into the silicon volumes 1310 and 1320, because copper degrades the proper use of any type of transistor, and of metal oxide semiconductor (MOS) transistors in particular. Thus, the damascene tungsten interconnects 120 may be generalized to, and identified as, electrically conducting regions 120 which include, inter alia, damascene refractory metal interconnects (e.g., damascene tungsten interconnects) or semiconductor material (e.g., silicon).

Figure 14A:
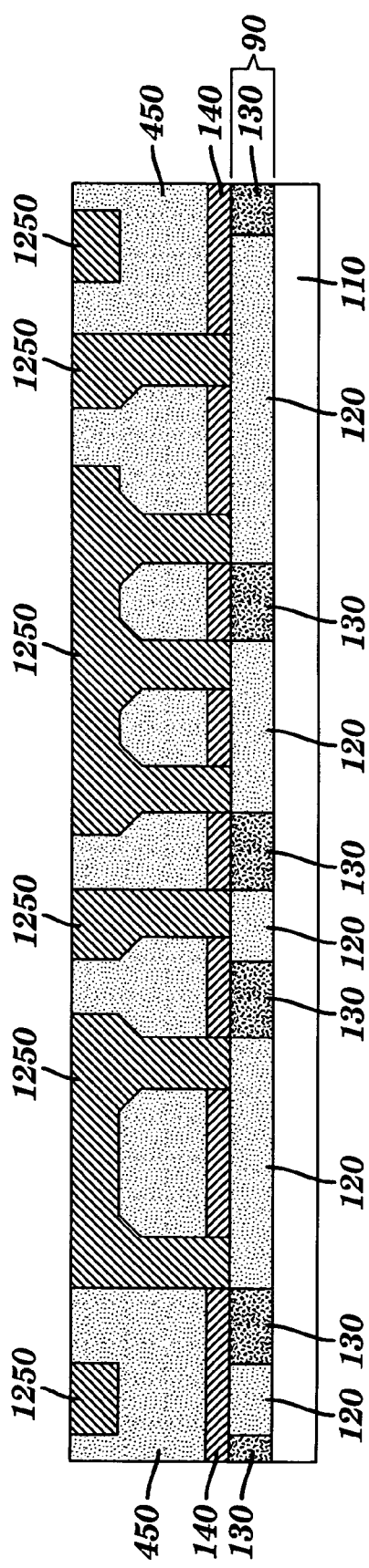
FIG. 14A depicts a cross-section view of an alternative embodiment of the present invention showing a multiplicity of dual damascene copper wires and contact vias.
Figure 14B:
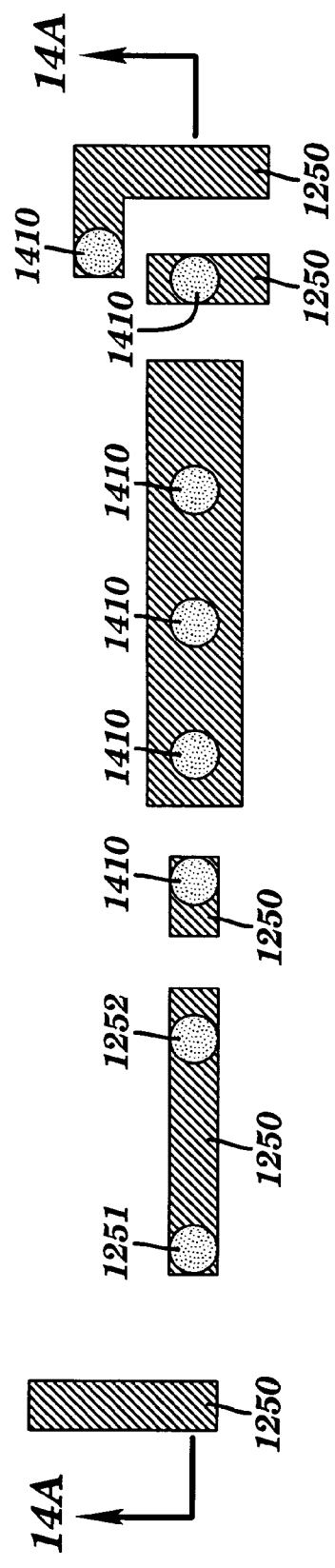
FIG. 14B depicts a plan view of the structure depicted in FIG. 14A.

Shown as a variant of FIG. 12, FIG. 14A and FIG. 14B depict a cross-sectional view and an associated plan view, respectively, of a multiplicity of dual damascene copper wires 1250 and contact vias 1251, 1252, 1410, with the contact vias 1251, 1252, 1410 connecting down to a damascene tungsten wiring level 90 at damascene tungsten interconnects 120. The damascene copper wires 1250 shown in FIG. 14B can have zero, one, or more than one, dual damascene contact vias 1251, 1252, 1410. FIG. 14B shows the plan view of the damascene copper wires 1250 and (hidden) dual damascene contact vias (the damascene tungsten wiring level, under the contact vias, is not shown). The size of the copper wires 1250 is not limited, and may be enlarged to form an electrically conductive level, such as, inter alia, a ground plane.

While the film 140 have been described herein as including silicon nitride, the film 140 may generally be viewed as an etch stop layer with respect to selectively etching the silicon dioxide layer 450 above, as described supra in conjunction with FIG. 5. Accordingly, the film 140 may include an etch stop insulative material such as, inter alia, silicon nitride, silicon carbide ($SiC_xH_y$), or silicon carbon-hydrogen-nitrogen compounds ($SiC_xH_yN_z$).

While the silicon dioxide layer 150 of FIGS. 1A–3A, the silicon dioxide cap layer 350 of FIG 3A and the silicon dioxide layer 450 of FIGS. 4–13, have each been described herein as including silicon dioxide, the layers 150, 350, and 450 may generally be viewed as electrically insulative layers which include an insulative material such as, inter alia, silicon dioxide, flourine doped or carbon doped dielectrics could be used to reduce the dielectric constant of the oxides.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
   a semiconductor substrate;
   a first layer on and in direct mechanical contact with the semiconductor substrate, wherein the first layer includes a plurality of electrically conducting regions, wherein the electrically conductive regions each consist of an electrically conductive material selected from the group consisting of tungsten and silicon, and wherein the electrically conducting regions are separated by insulative regions, wherein each insulative region comprises an insulative material, wherein a bottom surface of each electrically conductive region is coplanar with a bottom surface of the first layer, and wherein a top surface of each electrically conductive region is coplanar with a top surface of the first layer;
   a dual damascene copper interconnect wiring level having a plurality of damascene copper wires within one or more corresponding damascene contact vias wherein each damascene copper wire is in electrically conductive contact with a corresponding conducting region of the electrically conducting regions;
   an etch stop layer above the first layer, wherein the etch stop layer comprises etch stop regions, wherein the etch stop regions are mechanically separated from each other by the damascene contact via, wherein each etch stop region has a first bounding surface such that said first bounding surfaces are mutually coplanar and in direct mechanical contact with the electrically conductive material of the first layer, and wherein the etch stop layer includes an etch stop insulative material;
   a first insulator region of an insulator layer on a first portion of the etch stop layer and contacting a first surface of the damascene copper interconnect, wherein the first insulator region includes an electrically insulative material;
   a second insulator region of the insulator layer on a second portion of the etch stop layer and contacting a second surface of the damascene copper interconnect, wherein the second insulator region includes the electrically insulative material; and
   a third insulator region on a third portion of the etch stop layer and disposed between the damascene copper interconnect and the third portion of the etch stop layer, wherein the third insulator region includes the electrically insulative material, wherein the damascene copper interconnect wiring level comprises a dual damascene copper interconnect, and wherein the dual damascene copper interconnect comprises:
a first contact via and a second contact via;
a copper diffusion barrier layer on and in direct mechanical contact with bounding inner walls of the dual damascene copper interconnect and bounding inner walls of the first contact via and the second contact via, wherein the copper diffusion baffler layer is continuously distributed from the first contact via to the second contact via;
a sputtered or electroless plated thin copper layer on and in direct mechanical contact with the copper diffusion baffler layer, wherein the thin copper layer is continuously distributed from the first contact via to the second contact via, and wherein the height of the thin copper layer along a bounding inner wall of the dual damascene copper interconnect is greater than the height of the thin copper layer along a bounding inner wall of the first contact via; and
an electroplated copper layer on and in direct mechanical contact with the thin copper layer, wherein the electroplated copper layer fills the first contact via and the second contact via such that the electroplated copper layer is continuously distributed from the first contact via to the second contact via.

2. The electronic structure of claim 1, wherein the electrically conductive material consists of tungsten.

3. The electronic structure of claim 1, wherein the electrically conductive material consists of silicon.

4. The electronic structure of claim 1, wherein the copper diffusion baffler layer comprises one or more layers of tantalum nitride, tantalum, titanium nitride, tungsten nitride, or tungsten.

5. The electronic structure of claim 1, wherein the electrically insulative material is selected from the group consisting of: silicon dioxide, flourinated silicon dioxide, $CH_3$-doped silicon dioxide, phosphosilicate glass, and borophosphosilicate glass.

6. The electronic structure of claim 1, wherein the electrically insulative material of the third insulator region comprises beveled corner edges.

7. The electronic structure of claim 1, wherein each electrically conducting region is in direct mechanical contact with the insulative material.

8. The electronic structure of claim 1, wherein the etch stop insulative material is a same etch stop insulative material in each etch stop region.

9. The electronic structure of claim 1, wherein the insulative material is a same insulative material in each insulative region.

10. The electronic structure of claim 1, wherein the copper diffusion barrier layer comprises one or more layers of tantalum nitride, tantalum, tungsten nitride, or tungsten.

11. The electronic structure of claim 10, wherein the electrically conductive material consists of tungsten.

12. The electronic structure of claim 10, wherein the electrically conductive material consists of silicon.

* * * * *